(12) United States Patent
Pance et al.

(10) Patent No.: US 9,710,061 B2
(45) Date of Patent: Jul. 18, 2017

(54) HAPTIC FEEDBACK DEVICE

(75) Inventors: Aleksandar Pance, Saratoga, CA (US); Nicholas U. Webb, Menlo Park, CA (US); Sean A. Mayo, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 556 days.

(21) Appl. No.: 13/163,532

(22) Filed: Jun. 17, 2011

(65) Prior Publication Data

US 2012/0319827 A1  Dec. 20, 2012

(51) Int. Cl.
*H04B 3/36* (2006.01)
*G06F 3/01* (2006.01)
*H03K 17/96* (2006.01)

(52) U.S. Cl.
CPC .......... *G06F 3/016* (2013.01); *H03K 17/96* (2013.01); *H03K 2217/96062* (2013.01)

(58) Field of Classification Search
CPC ....... H04B 3/36; G06F 3/016; A61B 17/1285; A61B 2019/4873; A61B 19/2203; B60K 37/06; G05G 1/10; G05G 5/03
USPC ....... 340/407.1, 407.2, 425.5; 345/173, 156; 355/7; 463/30, 37; 318/460, 128, 451, 318/14
See application file for complete search history.

(56) References Cited

U.S. PATENT DOCUMENTS

| | | |
|---|---|---|
| 5,196,745 A | 3/1993 | Trumper et al. |
| 5,293,161 A | 3/1994 | MacDonald et al. |
| 5,424,756 A | 6/1995 | Ho et al. |
| 5,434,549 A | 7/1995 | Hirabayashi et al. |
| 5,436,622 A | 7/1995 | Gutman et al. |
| 5,739,759 A | 4/1998 | Nakazawa et al. |
| 6,084,319 A | 7/2000 | Kamata et al. |
| 6,342,880 B2 | 1/2002 | Rosenberg et al. |
| 6,373,465 B2 | 4/2002 | Jolly et al. |
| 6,388,789 B1 * | 5/2002 | Bernstein .............. B81B 3/0021 359/198.1 |
| 6,438,393 B1 | 8/2002 | Surronen |

(Continued)

FOREIGN PATENT DOCUMENTS

| | | |
|---|---|---|
| CN | 101036105 | 9/2007 |
| CN | 101409164 | 4/2009 |

(Continued)

OTHER PUBLICATIONS

Hasser et al., "Preliminary Evaluation of a Shape-Memory Alloy Tactile Feedback Display," Advances in Robotics, Mechantronics, and Haptic Interfaces, ASME, DSC—vol. 49, pp. 73-80, 1993.

(Continued)

*Primary Examiner* — Hoi Lau
(74) *Attorney, Agent, or Firm* — Brownstein Hyatt Farber Schreck, LLP

(57) ABSTRACT

A haptic feedback device configured to provide tactile or haptic feedback for an electronic device. The haptic device includes a platform operably secured to the electronic device to allow rotation about a center axis. An activating member is operably associated with the platform and configured to selectively cause the platform to rotate in a first direction. Also, the haptic feedback device includes a restoring member operably associated with the platform and configured to selectively return the platform to a first position after it has rotated for at least one of a select period of time or a select distance.

20 Claims, 6 Drawing Sheets

(56) References Cited

U.S. PATENT DOCUMENTS

| | | |
|---|---|---|
| 6,445,093 B1 | 9/2002 | Binnard |
| 6,493,612 B1 | 12/2002 | Bisset et al. |
| 6,693,622 B1* | 2/2004 | Shahoian et al. ............ 345/156 |
| 6,864,877 B2 | 3/2005 | Braun et al. |
| 6,952,203 B2 | 10/2005 | Banerjee et al. |
| 6,988,414 B2 | 1/2006 | Ruhrig et al. |
| 7,068,168 B2 | 6/2006 | Girshovich et al. |
| 7,080,271 B2 | 7/2006 | Kardach et al. |
| 7,130,664 B1 | 10/2006 | Williams |
| 7,234,379 B2 | 6/2007 | Claesson et al. |
| 7,253,350 B2 | 8/2007 | Noro et al. |
| 7,323,959 B2* | 1/2008 | Naka et al. .................... 335/205 |
| 7,339,572 B2 | 3/2008 | Schena |
| 7,355,305 B2 | 4/2008 | Nakamura et al. |
| 7,370,289 B1 | 5/2008 | Ebert et al. |
| 7,392,066 B2 | 6/2008 | Hapamas |
| 7,423,631 B2 | 9/2008 | Shahoian et al. |
| 7,508,382 B2 | 3/2009 | Denoue et al. |
| 7,667,691 B2 | 2/2010 | Boss et al. |
| 7,675,414 B2 | 3/2010 | Ray |
| 7,710,397 B2 | 5/2010 | Krah et al. |
| 7,710,399 B2 | 5/2010 | Bruneau et al. |
| 7,741,938 B2* | 6/2010 | Kramlich ........................ 335/77 |
| 7,755,605 B2 | 7/2010 | Daniel et al. |
| 7,798,982 B2 | 9/2010 | Zets et al. |
| 7,825,903 B2 | 11/2010 | Anastas et al. |
| 7,855,657 B2 | 12/2010 | Doemens et al. |
| 7,890,863 B2 | 2/2011 | Grant et al. |
| 7,893,922 B2 | 2/2011 | Klinghult et al. |
| 7,904,210 B2 | 3/2011 | Pfau et al. |
| 7,919,945 B2* | 4/2011 | Houston ................. A63F 13/06 310/14 |
| 7,952,261 B2 | 5/2011 | Lipton et al. |
| 7,952,566 B2 | 5/2011 | Poupyrev et al. |
| 7,976,230 B2* | 7/2011 | Ryynanen ............ G03B 11/043 318/117 |
| 8,002,089 B2 | 8/2011 | Jasso et al. |
| 8,040,224 B2 | 10/2011 | Hwang |
| 8,053,688 B2 | 11/2011 | Conzola et al. |
| 8,063,892 B2 | 11/2011 | Shahoian |
| 8,081,156 B2 | 12/2011 | Ruettiger |
| 8,125,453 B2 | 2/2012 | Shahoian et al. |
| 8,154,537 B2 | 4/2012 | Olien et al. |
| 8,169,402 B2* | 5/2012 | Shahoian et al. ............ 345/156 |
| 8,174,495 B2 | 5/2012 | Takashima et al. |
| 8,232,494 B2 | 7/2012 | Purcocks |
| 8,253,686 B2 | 8/2012 | Kyung |
| 8,265,292 B2 | 9/2012 | Leichter |
| 8,265,308 B2 | 9/2012 | Gitzinger et al. |
| 8,344,834 B2 | 1/2013 | Niiyama |
| 8,345,025 B2 | 1/2013 | Seibert et al. |
| 8,351,104 B2 | 1/2013 | Zaifrani et al. |
| 8,378,797 B2 | 2/2013 | Pance et al. |
| 8,378,965 B2 | 2/2013 | Gregorio et al. |
| 8,384,316 B2 | 2/2013 | Houston et al. |
| 8,390,218 B2 | 3/2013 | Houston et al. |
| 8,390,594 B2 | 3/2013 | Modarres et al. |
| 8,400,027 B2 | 3/2013 | Dong et al. |
| 8,471,690 B2 | 6/2013 | Hennig et al. |
| 8,493,177 B2 | 7/2013 | Flaherty et al. |
| 8,598,750 B2 | 12/2013 | Park |
| 8,598,972 B2 | 12/2013 | Cho et al. |
| 8,605,141 B2 | 12/2013 | Dialameh et al. |
| 8,619,031 B2 | 12/2013 | Hayward |
| 8,624,448 B2 | 1/2014 | Kaiser et al. |
| 8,633,916 B2 | 1/2014 | Bernstein et al. |
| 8,639,485 B2 | 1/2014 | Connacher et al. |
| 8,681,130 B2 | 3/2014 | Adhikari |
| 8,717,151 B2 | 5/2014 | Forutanpour et al. |
| 8,730,182 B2 | 5/2014 | Modarres et al. |
| 8,749,495 B2 | 6/2014 | Grant et al. |
| 8,754,759 B2 | 6/2014 | Fadell et al. |
| 8,760,037 B2 | 6/2014 | Eshed et al. |
| 8,797,153 B2* | 8/2014 | Vanhelle ................ B60K 37/06 200/4 |
| 8,803,670 B2 | 8/2014 | Steckel et al. |
| 8,867,757 B1 | 10/2014 | Ooi |
| 8,872,448 B2 | 10/2014 | Boldyrev et al. |
| 8,878,401 B2 | 11/2014 | Lee |
| 8,976,139 B2 | 3/2015 | Koga et al. |
| 8,981,682 B2* | 3/2015 | Delson ................... A63F 13/06 318/114 |
| 8,987,951 B2 | 3/2015 | Park |
| 9,054,605 B2 | 6/2015 | Jung et al. |
| 9,086,727 B2 | 7/2015 | Tidemand et al. |
| 9,104,285 B2 | 8/2015 | Colgate et al. |
| 9,122,330 B2 | 9/2015 | Bau et al. |
| 9,134,796 B2 | 9/2015 | Lemmens et al. |
| 9,172,669 B2 | 10/2015 | Swink et al. |
| 9,286,907 B2 | 3/2016 | Yang et al. |
| 9,304,587 B2 | 4/2016 | Wright et al. |
| 9,396,629 B1 | 7/2016 | Weber |
| 9,489,049 B2 | 11/2016 | Li |
| 9,496,777 B2 | 11/2016 | Jung |
| 9,501,149 B2 | 11/2016 | Birnbaum et al. |
| 2003/0117132 A1* | 6/2003 | Klinghult ................ G01D 5/147 324/207.25 |
| 2004/0178989 A1* | 9/2004 | Shahoian ................ G06F 3/016 345/156 |
| 2005/0036603 A1 | 2/2005 | Hughes |
| 2005/0219206 A1* | 10/2005 | Schena et al. ................ 345/156 |
| 2005/0230594 A1 | 10/2005 | Sato et al. |
| 2006/0209037 A1 | 9/2006 | Wang et al. |
| 2006/0223547 A1 | 10/2006 | Chin et al. |
| 2006/0252463 A1 | 11/2006 | Liao |
| 2006/0255683 A1* | 11/2006 | Suzuki et al. ................ 310/317 |
| 2006/0290662 A1* | 12/2006 | Houston ................. A63F 13/06 345/156 |
| 2007/0106457 A1 | 5/2007 | Rosenberg |
| 2007/0152974 A1 | 7/2007 | Kim et al. |
| 2007/0279401 A1* | 12/2007 | Ramstein ................ G06F 3/016 345/184 |
| 2008/0062145 A1 | 3/2008 | Shahoian |
| 2008/0084384 A1 | 4/2008 | Gregorio et al. |
| 2008/0111791 A1 | 5/2008 | Nikittin |
| 2008/0158149 A1 | 7/2008 | Levin |
| 2008/0229871 A1* | 9/2008 | Kramlich ........................ 74/527 |
| 2009/0002205 A1* | 1/2009 | Klinghult et al. .............. 341/33 |
| 2009/0085879 A1 | 4/2009 | Dai et al. |
| 2009/0115734 A1* | 5/2009 | Fredriksson et al. ......... 345/173 |
| 2009/0128501 A1* | 5/2009 | Lazaridis ............ G06F 3/0414 345/173 |
| 2009/0166098 A1 | 7/2009 | Sunder |
| 2009/0167542 A1 | 7/2009 | Culbert et al. |
| 2009/0167702 A1 | 7/2009 | Nurmi |
| 2009/0167704 A1 | 7/2009 | Terlizzi et al. |
| 2009/0174672 A1 | 7/2009 | Schmidt |
| 2009/0207129 A1* | 8/2009 | Ullrich ................... H01H 13/70 345/156 |
| 2009/0225046 A1 | 9/2009 | Kim et al. |
| 2009/0231271 A1* | 9/2009 | Heubel et al. ................ 345/156 |
| 2009/0243404 A1 | 10/2009 | Kim et al. |
| 2009/0267892 A1 | 10/2009 | Faubert |
| 2009/0267920 A1 | 10/2009 | Faubert et al. |
| 2009/0278671 A1* | 11/2009 | Meadors ..................... 340/407.2 |
| 2009/0313542 A1 | 12/2009 | Cruz-Hernandez et al. |
| 2010/0048256 A1 | 2/2010 | Huppi et al. |
| 2010/0056953 A1* | 3/2010 | Couvillon, Jr. ................ 600/564 |
| 2010/0097198 A1* | 4/2010 | Suzuki ....................... 340/407.2 |
| 2010/0116629 A1* | 5/2010 | Borissov ................ H01H 25/008 200/4 |
| 2010/0225600 A1 | 9/2010 | Dai et al. |
| 2010/0267424 A1 | 10/2010 | Kim et al. |
| 2010/0328229 A1 | 12/2010 | Weber et al. |
| 2011/0021272 A1* | 1/2011 | Grant et al. ..................... 463/30 |
| 2011/0111852 A1* | 5/2011 | Cohen et al. ..................... 463/37 |
| 2011/0115754 A1* | 5/2011 | Cruz-Hernandez ........... 345/184 |
| 2011/0128239 A1 | 6/2011 | Polyakov et al. |
| 2011/0132114 A1 | 6/2011 | Siotis |
| 2011/0140870 A1* | 6/2011 | Ullrich ................... A61B 34/76 340/407.2 |
| 2011/0148554 A1* | 6/2011 | Cho ........................ H02K 33/16 335/220 |

(56) References Cited

U.S. PATENT DOCUMENTS

| | | |
|---|---|---|
| 2011/0163946 A1 | 7/2011 | Tartz et al. |
| 2011/0205038 A1* | 8/2011 | Drouin ............... G06F 3/016 340/407.2 |
| 2011/0210834 A1* | 9/2011 | Pasquero et al. ......... 340/407.1 |
| 2011/0210926 A1* | 9/2011 | Pasquero et al. ............ 345/173 |
| 2011/0304574 A1* | 12/2011 | Harrison ..................... 345/173 |
| 2012/0056825 A1* | 3/2012 | Ramsay ................. G06F 3/016 345/173 |
| 2012/0062491 A1 | 3/2012 | Coni et al. |
| 2012/0096351 A1* | 4/2012 | Shahoian et al. ............. 715/702 |
| 2012/0127071 A1 | 5/2012 | Jitkoff et al. |
| 2012/0127088 A1* | 5/2012 | Pance ................... G06F 3/016 345/173 |
| 2012/0223824 A1 | 9/2012 | Rothkopf |
| 2012/0235942 A1 | 9/2012 | Shahoian |
| 2012/0249315 A1* | 10/2012 | Vanhelle ............... B60K 37/06 340/425.5 |
| 2012/0268412 A1* | 10/2012 | Cruz-Hernandez ... G06F 3/0488 345/174 |
| 2012/0286943 A1 | 11/2012 | Rothkopf et al. |
| 2012/0319827 A1* | 12/2012 | Pance ................... G06F 3/016 340/407.1 |
| 2012/0327006 A1 | 12/2012 | Israr et al. |
| 2013/0002341 A1* | 1/2013 | Maier et al. .................. 327/510 |
| 2013/0016042 A1 | 1/2013 | Makinen et al. |
| 2013/0044049 A1* | 2/2013 | Biggs et al. .................. 345/156 |
| 2013/0127755 A1 | 5/2013 | Lynn et al. |
| 2013/0207793 A1 | 8/2013 | Weaber et al. |
| 2013/0253818 A1 | 9/2013 | Sanders et al. |
| 2013/0278401 A1 | 10/2013 | Flaherty et al. |
| 2014/0002386 A1 | 1/2014 | Rosenberg et al. |
| 2014/0028573 A1 | 1/2014 | Olien et al. |
| 2014/0125470 A1 | 5/2014 | Rosenberg |
| 2014/0218183 A1 | 8/2014 | Van Schyndel et al. |
| 2014/0218853 A1 | 8/2014 | Pance et al. |
| 2014/0225831 A1 | 8/2014 | Shinozaki et al. |
| 2014/0274398 A1 | 9/2014 | Grant |
| 2014/0282270 A1 | 9/2014 | Slonneger |
| 2015/0097800 A1 | 4/2015 | Grant et al. |
| 2015/0116205 A1 | 4/2015 | Westerman et al. |
| 2015/0126070 A1 | 5/2015 | Candelore |
| 2015/0130730 A1 | 5/2015 | Harley et al. |
| 2015/0135121 A1 | 5/2015 | Peh et al. |
| 2015/0205357 A1 | 7/2015 | Virtanen et al. |
| 2015/0234493 A1 | 8/2015 | Parivar et al. |
| 2015/0277562 A1 | 10/2015 | Bard et al. |
| 2015/0338919 A1 | 11/2015 | Weber et al. |
| 2015/0349619 A1 | 12/2015 | Degner et al. |
| 2016/0011664 A1 | 1/2016 | Silvanto et al. |
| 2016/0328930 A1 | 11/2016 | Weber et al. |
| 2017/0003744 A1 | 1/2017 | Bard et al. |

FOREIGN PATENT DOCUMENTS

| | | |
|---|---|---|
| CN | 101663104 | 3/2010 |
| CN | 101872257 | 10/2010 |
| EP | 1686776 | 8/2006 |
| EP | 2743798 | 6/2014 |
| JP | 2004129120 | 4/2004 |
| JP | 2004236202 | 8/2004 |
| JP | 2010537279 | 12/2010 |
| JP | 2010540320 | 12/2010 |
| KR | 20050033909 | 4/2005 |
| TW | 2010035805 | 10/2010 |
| WO | WO02/073587 | 9/2002 |
| WO | WO2006/091494 | 8/2006 |
| WO | WO 2007/049253 | 5/2007 |
| WO | WO2007/114631 | 10/2007 |
| WO | WO2009/038862 | 3/2009 |
| WO | WO 2010/129892 | 11/2010 |
| WO | WO 2013/169303 | 11/2013 |
| WO | WO2014/066516 | 5/2014 |

OTHER PUBLICATIONS

Hill et al., "Real-time Estimation of Human Impedance for Haptic Interfaces," Stanford Telerobotics Laboratory, Department of Mechanical Engineering, Stanford University, 6 pages, at least as early as Sep. 30, 2009.

Lee et al, "Haptic Pen: Tactile Feedback Stylus for Touch Screens," Mitsubishi Electric Research Laboratories, http://wwwlmerl.com, 6 pages, Oct. 2004.

International Search Report, PCT/US2012/040915, 6 pages, Jan. 14, 2013.

* cited by examiner

HAPTIC FEEDBACK DEVICE

TECHNICAL FIELD

The present invention relates generally to electronic devices, and more specifically, to haptic output devices for electronic devices.

BACKGROUND

Electronic devices may utilize haptic feedback to provide the user with tactile response to a particular input by the user, or an output of the device. For example, some mobile electronic devices may include a mechanical button that physically depresses in response to a user's press. These mechanical buttons may include a stackup including a mechanical dome switch underneath the actual button. The feedback provided to the user may then be the actual depression of the dome switch. However, this stackup may require the enclosure to have a particular height so that the button may travel downwards and upwards. Similarly, other haptic devices may include actuators that produce a tactile response by mechanically vibrating or linearly moving the surface of the button (in either in the x, y, or z direction). As with a mechanical button, because the feedback requires the device to move in at least one dimension, the mechanical tolerances for the device enclosure may be required to accommodate the movement of the button in a particular direction. Additionally, the movement in the x, y, or z direction also may prevent the enclosure from being sealed, e.g., from dust or moisture.

SUMMARY

One example of the disclosure may take the form of a haptic device configured to provide tactile or haptic feedback for an electronic device. The haptic device includes a platform operably secured to the electronic device to allow rotation around a center axis. An activating member is operably associated with the platform and configured to selectively cause the platform to rotate in a first direction, which may be in response to a user input. Also, the haptic feedback device includes a restoring member operably associated with the platform and configured to selectively return the platform to a first position after it has rotated for at least one of a select period of time or a select distance.

Another example of the disclosure may take the form of an electronic device. The electronic device may include an enclosure, a processor operably connected to the enclosure and a haptic device. The haptic device may be operably connected to the enclosure so that at least a portion of the haptic device may be accessible through the enclosure. The haptic device may include a platform or surface operably associated with the enclosure. Also, the haptic device may include an activating member in communication with the processor and operably associated with the platform and a restoring member operably associated with the platform. The activating member is configured to rotate the platform along a center axis.

Still another example of the disclosure may take the form of a method for providing tactile feedback. The method may include detecting a user input, e.g., a user's touch. Then, rotating a device about a center axis in response to the user input. After the device has been rotated, restoring the device to an original position after one of a select time or a select rotation distance.

SPECIFICATION

Overview

Figure 1A:
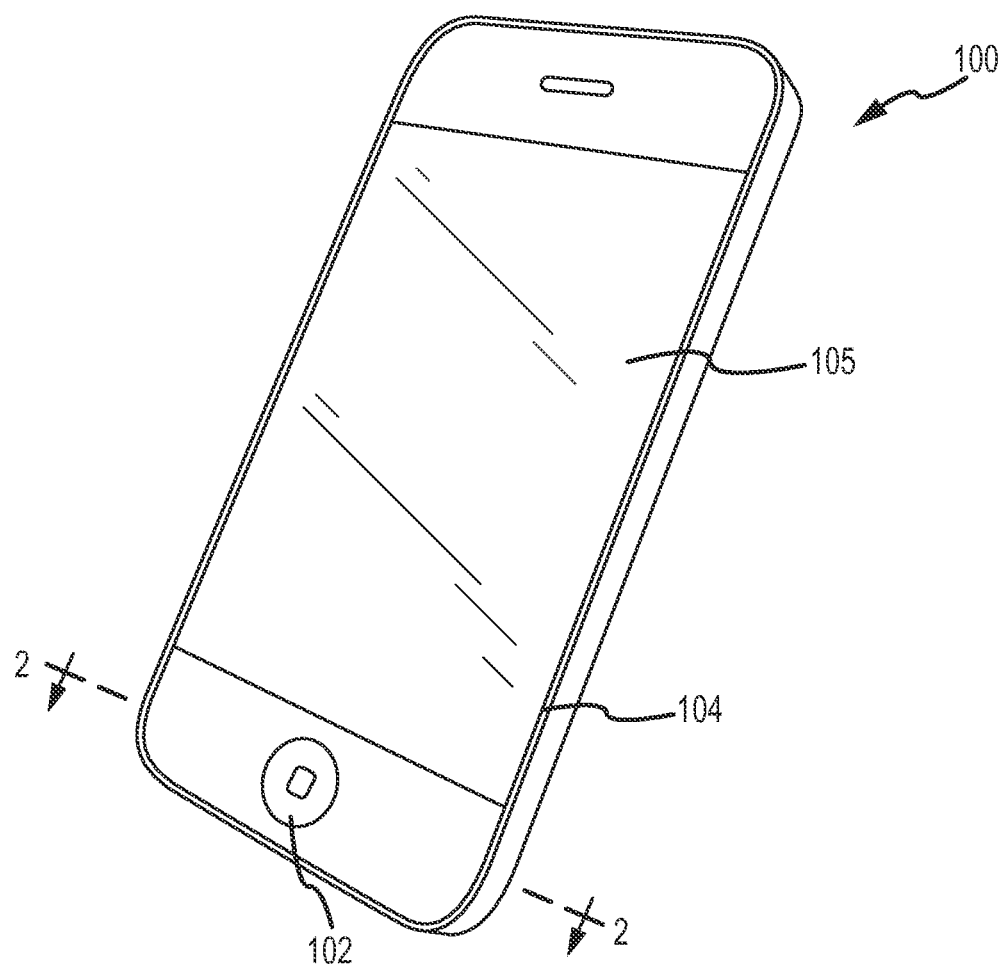
FIG. 1A is an isometric view of a mobile electronic device including a haptic button.

In some embodiments herein, a haptic device for an electronic device is disclosed. The haptic device provides feedback either in response to a user's input or as an output of the electronic device. The haptic device may be configured to provide a linear or vertical feel feedback, although the haptic device may not move in a linear direction along its x, y, or z axis (horizontal or vertical directions). Rather, the haptic device rotates about a center axis. When a user is contacting the haptic device while it is rotating, the user may feel that that the movement is in a linear direction, that is, along either a horizontal or vertical direction. This is because the rotation may be substantially fast or small enough so as to appear to the user that the movement is vertical or horizontal. Therefore, the haptic device may have substantially the same feel to a user as a vertically or horizontally displacing haptic device, but without requiring significant displacement in the x, y, or z direction.

The haptic device may include an actuator for asserting an actuating force on the haptic device to rotate the device. Additionally, the haptic device may include a restoring force to return the haptic device to its original position prior to the activation, or a second position after rotation. The haptic device may be secured to the electronic device along at least a portion of its center axis or outer perimeter, and the haptic device is configured to rotate around its center axis. This rotation provides a tactile feel to the user, as if the movement is in a vertical direction. The haptic device may also include a sensor for determining when the haptic device has been touched or otherwise activated by a user.

In one example, the actuator may include an electromagnet and a metallic or magnetic material that may be operably connected to or embedded within at least a portion of the haptic device. The electromagnet may be secured to a side of the electronic device near the haptic device and may then selectively attract and repulse the magnetic or metallic material operably connected to the haptic device.

In another example, the actuator may include a printed electroactive polymer material. The electroactive polymer material may be positioned underneath the device and may contract or move when a particular voltage or current is applied. The electroactive polymer may then rotate the device as it contracts or moves in particular direction.

The haptic device may also include a restoring member. The restoring member may help to restore the haptic device to its original, pre-activated, position. For example, the restoring device may be a spring that exerts a biasing force on a platform of the device. The biasing force may be overcome by the activation force, allowing the device to rotate. However, once the activation force is reduced or eliminated, the biasing force may return the haptic device (or a platform of the haptic device) to its original position. In another example, the restoring force may be a gel or other compliant material that may surround a portion or perimeter of the haptic device. Similar to the spring, the gel may exert an initial force (due to the tackiness or stickiness of the gel), and the initial force may be overcome by the activation force, but then may return the haptic device to its original position or other resting position when the activation force is reduced or eliminated.

DETAILED DESCRIPTION

The haptic device may be included in an electronic device to provide feedback for the device. FIG. 1A is an isometric view of an electronic device 100 including a haptic device 102. The electronic device 100 may be virtually any type of device where haptic feedback may be desired, such as a smart phone (e.g., iPhone by APPLE, Inc.), digital music player (e.g., MP3 player), digital camera, video gaming device, laptop or tablet computer, and so on. The haptic device 102 may be a button, switch or other input/output member operably connected to an enclosure 104 of the electronic device 100.

In addition to the haptic device 102, the electronic device 100 may also include an enclosure 104. The enclosure 104 may form a portion of an exterior of the electronic device 100, and may at least partially enclose the various internal components of the electronic device 100.

The electronic device 100 may also include a display screen 105 that may provide an output for the electronic device 100. The display screen 105 may be a liquid crystal display screen, plasma screen, and so on. Additionally, in some embodiments the display screen 105 may function as both an input and an output device. For example, the display screen 105 may include capacitive input sensors so that a user may provide input signals to the electronic device 100 via his or her finger.

The haptic device 102 may function as an input device as well as a feedback device. In one example, the haptic device 102 permits a user to provide input to the mobile computing device 100. The haptic device 102 when activated may provide an input to the electronic device 100. For example, the haptic device 102 may, for example, and not by way of limitation, alter the volume, return to a home screen. Additionally, the haptic device 102 may be virtually any size, shape, and may be located in any area of the electronic device 100. The haptic device 102 may be positioned on a front, back or side surface of the electronic device 100. In one example, the haptic device 102 may be positioned on a front bottom surface of the electronic device 100.

The haptic device 102 is configured so that it may be touched, pressed or otherwise felt by a user. In one example, a portion of the haptic device 102 may be accessible through the enclosure 104, e.g., either through an aperture in the enclosure 104 or the haptic device may form a portion of the enclosure 104. The haptic device 102 may be accessible through the enclosure 104 so that a user may substantially feel movement of the haptic device 104.

Figure 1B:
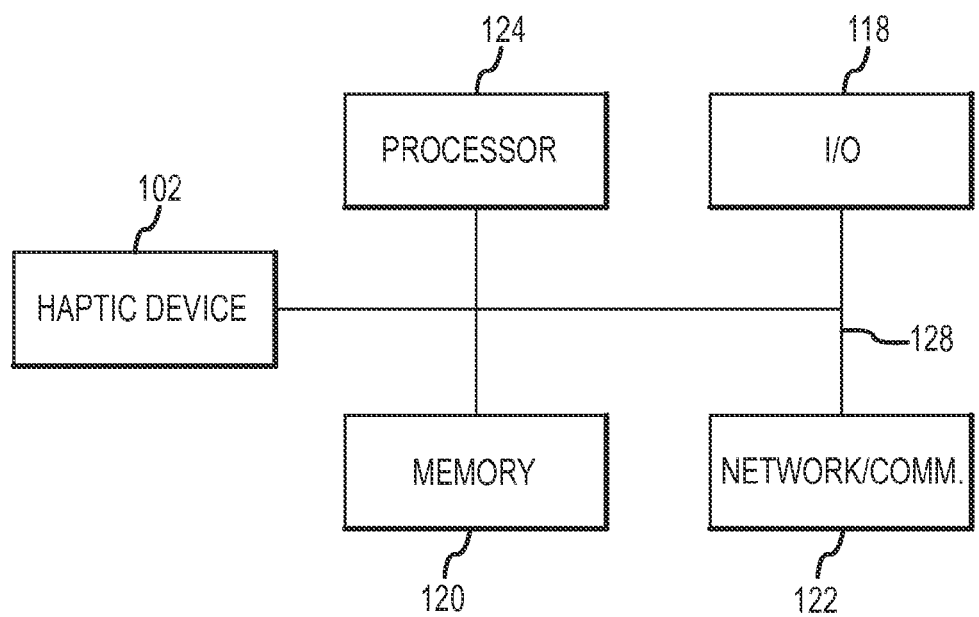
FIG. 1B is an exemplary block diagram of the mobile electronic device of FIG. 1A.

FIG. 1B is a block diagram of an embodiment of the electronic device 100 illustrating select electrical components. The electronic device 100 may include a processor 124, memory 120, a network/communication interface 122, and an input/output interface 118 all connected together by a system bus 128. The electronic device 100 may include additional and/or alternative components that are not shown; and FIG. 1B is meant to be exemplary only.

The network/communication interface 122 may receive and transmit various electrical signals. For example, the network/communication interface 122 may be used to place phone calls from the electronic device 100, may be used to receive data from a network, or may be used to send and transmit electronic signals via a wireless or wired connection (e.g., Internet, WiFi, Bluetooth, or Ethernet).

The memory 120 may store electronic data that may be utilized by electronic device 100. For example, the memory 120 may store electrical data, including, but not limited to, audio files, video files, and document files, corresponding to various applications. The memory 120 may be, for example, non-volatile storage, a magnetic storage medium, optical storage medium, magneto-optical storage medium, read only memory, random access memory, erasable programmable memory, or flash memory.

The processor 116 may control operation of the electronic device 100 and its various components. The processor 116 may be in communication with the haptic device 102 and may activate and/or receive input from the haptic device 102 as necessary or desired. The processor 116 may be any electronic device cable of processing, receiving, and/or transmitting instructions. For example, the processor 116 may be a microprocessor or a microcomputer.

The input/output interface 118 facilitates communication by the electronic device 100 to and from a variety of devices/sources. For example, the input/output interface 118 may receive data from user or control buttons on the electronic device 100. Other operations, well known in the art, may also be performed by the input/output interface. Additionally, the input/output interface 118 may also receive/transmit data to and from an external drive, e.g., a universal serial bus (USB), or other video/audio/data inputs.

Figure 2:
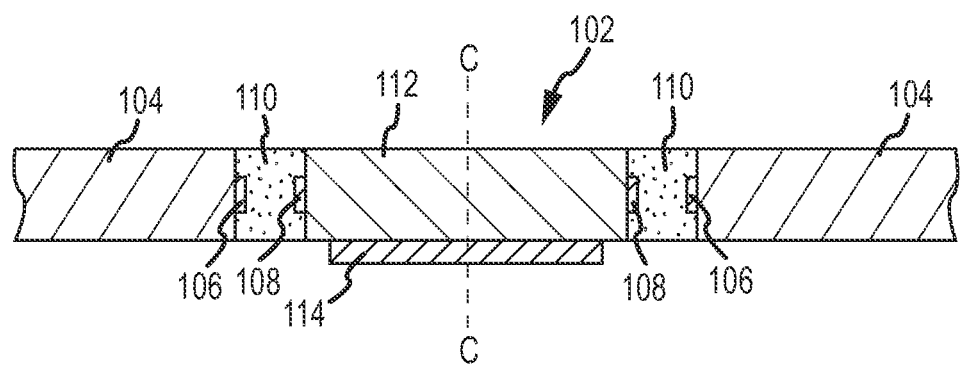
FIG. 2 is a cross-sectional view of the mobile electronic device taken along line 2-2 in FIG. 1 illustrating a first embodiment of the haptic button.
Figure 3:
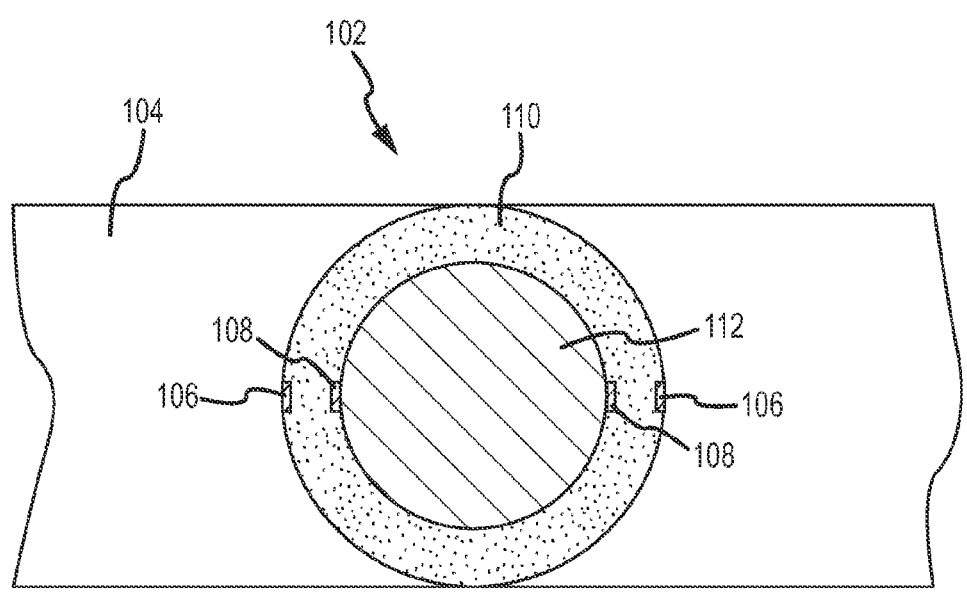
FIG. 3 is an enlarged top plan view of the haptic button of FIG. 2.

FIG. 2 is a cross-sectional view the electronic device of FIG. 1A, illustrating a first embodiment of the haptic device 102. FIG. 3 is a top plan view of haptic device 102 of FIG. 2. The haptic device 102 may include a platform 112 or button that may be operably connected to the enclosure 104 by a restoring member 110. A sensor 114 may be operably connected to the platform 112. An actuator member 108 may be operably connected to a portion of the platform 112 and a corresponding actuator 106 may be operably connected to the enclosure 104, but be in communication with the platform 112.

The platform 112, which in at least one embodiment may be a touch surface, provides a surface for user interactions. For example, a user may touch the platform 112 in order to provide an input to the electronic device 100, or in order to feel feedback from the electronic device 100. In one example, the platform 112 may be formed of a similar material to the enclosure 104 or substantially any other type of material. The platform 112 is configured to rotate about its center axis, illustrated as line C in FIG. 2. In this example, the platform 112 may be operably connected to the enclosure 104 at its center point, but be able to rotate around its center point. For example, the platform 112 may include a support bar or member that is fixed, and the platform 112 may rotate around the support bar or member (not shown). In another example, the platform 112 may rotate around its center point, but may be operably connected to the enclosure 104 about its outer perimeter, e.g., an external diameter of the platform 112 may secure the platform 112 to the enclosure 104.

With continuing reference to FIGS. 2 and 3, the haptic device 102 may further include a restoring member 110 operably connected around a portion of the platform 112. The restoring member 110 is configured to restore the platform 112 to a first or originating position after it has been rotated by the actuator 106. Additionally, the restoring member 110 may exert an initial force on the platform 112 so that the platform 112 may be partially rigid or secured in a non-activated or originating position. For example, the restoring member 110 may utilize a force, such as friction or a biasing force, to retain the platform 112 in its resting position when the haptic device 102 is deactivated, and return the platform 112 to the resting position after the platform 112 has been rotated.

In one example, the restoring member 110 may be a gel substance, including but not limited to, a silicon based gel or alpha gel, that may be positioned around the sides of the platform 112. In another configuration, the gel substance may be positioned completely around the sides and bottom surface of the platform 112. In other words, the platform 112 may be substantially supported on top of the restoring member 110. In embodiments utilizing a gel substance, the gel may include a tackiness that may provide the initial force exerted on the platform 112. For example, the platform 112 may have a high coefficient of friction that may restrain the platform 112 under particular forces (that may be overcome by the actuator 106).

In other examples, the restoring member 110 may actively exert a force on the platform 110 to rotate the platform 112 back to an initial position. This may allow the restoring member 110 to provide additional haptic feedback for the user, as the restoring force may be felt as the user exerts a force on the platform 112. For example, the restoring member 110 may be an electromagnet or an electroactive polymer and may be similar to the actuating members described in more detail below with respect to FIG. 4.

In still other examples, the restoring member 110 may be a spring operably connected to the platform 112. In this example, the initial force may be the biasing force of the spring, which may be overcome by the force of the actuator 106. Similarly, the restoring member 110 may be a gasket or a magnetic force that may exert an initial force on either the actuating members 108 and/or the platform 112. Furthermore, the restoring member 110 may be incorporated into the actuator 106. For example, if the actuator 106 is an electromagnet or programmable magnet, the polarity or field may be alternated between an initial force, that may retain the platform 112 in a particular position and an activating force that may rotate the platform 112.

The initial force exerted by the restoring member 110 may be configured so that the rotational force exerted by the actuator 106 may overcome the initial force. This allows the platform 112 to rotate when activated, but remain substantially secured in place when not activated. The restoring member 110 may further help the tactile feel of the platform 112, so that the platform 112 does not feel loose or wobbly when operably connected to the enclosure 104, although platform 112 may be operably connected to the enclosure 104 along its center axis.

As shown in FIG. 3, which is an exemplary illustration the restoring member 110, the restoring member 110 may be exposed around the outer perimeter of the platform 112. However, it should be noted that in other embodiments, the enclosure 104 may extend to the outer perimeter of the platform 112, so as to substantially cover the restoring member 110. In other words, the enclosure 104 may terminate at the edge of the platform 112, so that the restoring member 110 may not be substantially visible. In other embodiments, the restoring member 110 may be positioned around an inner perimeter (not shown) of the platform 112. Such an embodiment may be desirable, for example, when the platform is configured in an oval, donut, or similar shape having an inner or outer surface to which the restoring member 110 may provide a restorative force upon the platform 112.

Figure 4:
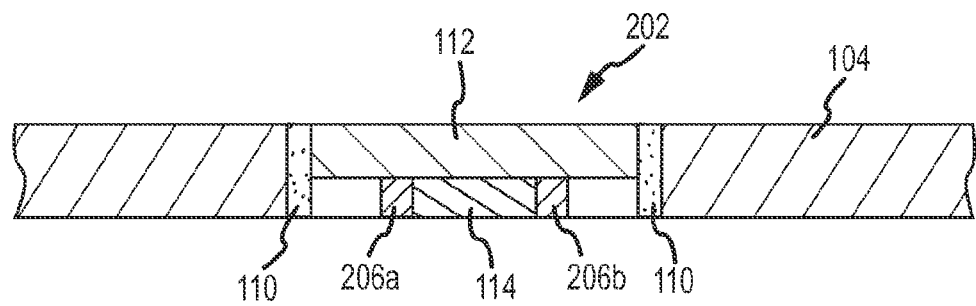
FIG. 4 is a cross-sectional view of the mobile electronic device taken along line 2-2 in FIG. 1 illustrating a second embodiment of the haptic button.

The haptic device 102 may also include a sensor 114 operably connected to the platform 112. The sensor 114 may be integrated with the platform 112 or may be a separate element connected thereto. Additionally, although as shown in FIGS. 2 and 4, the sensor 114 is positioned underneath the platform 112, it should be noted that the sensor 114 may be positioned in substantially any location of the device 100 as long as it is positioned to detect a user's selection. For example, the sensor 114 may be positioned on a top surface of the platform, e.g., a capacitive sensing ring may be positioned on the top surface of the platform 112. In another example, the sensor 114 may be positioned on a side of the platform 112 or on a side of the enclosure 104 facing the platform.

The sensor 114 may determine when a user has selected, pressed, otherwise touched the platform 112. The sensor 114 may be substantially any type of sensor that can detect a user's touch or selection. For example, the sensor 114 may sense capacitance, heat, light, pressure, moisture, and so on. The sensor 114 may be in electrical communication with the processor 124.

The actuating member 108 may be operably connected to a side or outer surface of the platform 112. In one example, as shown in FIGS. 2 and 3, there may be two actuating members 108 operably connected at opposite sides of the platform 112. However, practically any number of actuating members 108 may be used, and the actuating members 108 may be positioned practically anywhere on the platform 112. The actuating member 108 is configured to cause the platform 112 to rotate around its center axis by communicating with a corresponding actuator 106 operably connected to the enclosure 104. The actuating members 108 may drive the platform 112 from a single side or multiple sides. In other words, there may be a single actuating member 108 or there may be multiple actuating members 108.

The actuator 106 may be operably connected to the enclosure 104 and may be in communication with the processor 116. The actuator 106 is configured to selectively activate the actuating members 108 to rotate the platform 112. The actuator 106 may be configured so that the platform 112 may rotate for a select time, distance, or other variable.

In one example, the actuating member 108 may be a metallic or magnetic surface and the actuator 106 may be an electromagnet. In this example, the actuator 106 may be selectively magnetized, which may produce a magnetic force that may interact with the actuating members 108. The magnetic force may cause the actuating members 108 to be forced either away from or towards the actuator 106. Because the actuating members 108 are operably connected to the platform 112, as the actuating members 108 are forced in a particular direction, the platform 112 may move in that direction. In other words, as the actuator 106 is selectively activated (charged/discharged), the platform 112 may rotate due to the varying forces exerted on the actuating members 108 by the actuator 106.

In another example, the actuator 106 may be a motor operably connected to the platform 112 and configured to cause the platform 112 to selectively rotate. For example, the motor may include a drive shaft operably connected to a center point of the platform 112, so that as the drive shaft rotates, the platform 112 may rotate. In another example, one or multiple micro-motors may be operably connected to the sides of the platform 112 in order to rotate the platform 112.

Referring to FIGS. 1A-3, in operation, a user may select or press the haptic device 102. As the user touches the platform 112 and/or the sensor 114, the sensor 114 may detect that the user has selected the haptic device 102. The sensor 104 may then communicate to the processor 124, which may then activate the actuator 106. As the actuator 106 is activated, the actuating members 108 may experience a force. The force may be exerted on the two sides of the platform 112, causing the actuating members 108 to be forced towards (or away from) the corresponding actuator 106. As the actuating members 108 are pulled (or pushed) by the actuators 106, they cause the platform 112 to rotate along a center axis. The platform 112 then rotates, providing a tactile feel to the user.

As the platform 112 is rotated it may not substantially move vertically. This means that the platform 112 may not substantially move in the z direction. Similarly, the platform 112 may not substantially move in the horizontal directions (x and y axes). However, although the platform 112 may not substantially move in the horizontal or vertical directions, the user will experience (psychologically) that the platform 112 is displacing along either the vertical or horizontal directions. This is because in some embodiments, the platform 112 may only rotate a small distance (approximately 100 to 200 μm) or very quickly, and as experienced by the user the small movement distance may feel like a horizontal or vertical movement.

Furthermore, because the platform 112 rotates within a single plane, the height required for the haptic device 102 may be reduced, as compared with haptic devices that require movement to produce feedback. Reducing the height of the haptic device 102 may allow the height of the enclosure 104 to be reduced and/or for other internal components of the electronic device 100 to be increased in size. This may further allow the enclosure 104 to be configured so as to substantially seal an internal cavity of the electronic device 100. This is possible because there may be minimal movement or displacement tolerances that need to be taken into account with the haptic device 102. Unlike haptic devices that provide feedback by displacing in either the horizontal or vertical directions, the haptic device 102 may not require any additional movement space, as the haptic device 102 may not move wider or higher than its surface. This allows for the haptic device 102 to provide feedback without requiring tolerances required to be built into the electronic device 100 to accommodate a displacement motion.

It should be noted that in some instances, the platform 112 may be able to travel slightly in a linear direction. This may assist the sensor 114 in determining whether the user has selected the haptic device 102. For example, the sensor 114 may be configured to measure a force exerted by the user on the platform 112. In instances where the platform 112 may be configured to travel a small distance, e.g., 5-10 μm, the sensor 114 may sense a displacement of the platform 112 in order to determine the force. Similarly, in other examples, the platform 112 may travel slightly in a linear direction to further increase the haptic feedback felt by the user. For example, the platform 112 may be combined with vertical movement to increase the "depression" felt by a user.

Figure 5:
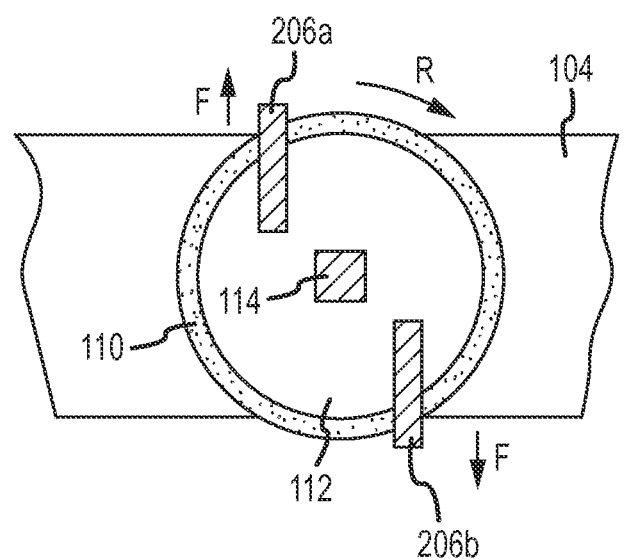
FIG. 5 is an enlarged bottom plan view of the haptic button of FIG. 4.

FIG. 4 is a cross-sectional view of a second embodiment of the haptic device 202. FIG. 5 is a bottom plan view of the haptic device 202 of FIG. 4. The haptic device 202 may be substantially similar to the haptic device 102 of FIG. 3, but may not include an actuating member. This is because an actuator 206 may be operably connected to the platform 112 and the enclosure 104, so that the actuator 206 may be activated and rotate the platform 121 on its own.

In one example, there may be a first actuator 206a and a second actuator 206b. However, in other embodiments, there may be only a single actuator or multiple actuators. The actuators 206a, 206b may be operably connected to a bottom surface of the platform 112 (as shown in FIG. 5), and may be operably connected to the enclosure 104. The first actuator 206a may be operably connected to a first side of the platform 112 and may be offset from a center point of the platform 112. The second actuator 206b may be operably connected to the platform 112 on a substantially opposite side from the first actuator 206a. Additionally, the second actuator 206b may be positioned offset of the center point, but offset in the opposite direction of the first actuator 206a. In other words, the actuators 206a, 206b may be operably connected to opposite halves of the platform 112 and positioned on opposite sides of the platform 112 from one another.

The actuators 206a, 206b are configured to linearly move based on a select input or voltage. In one example, the actuators 206a, 206b may be an electroactive polymer that may contract or otherwise change in shape or dimensions in response to a select voltage. In this example, the actuators 206a, 206b may be approximately 100 μm thick. However, other materials may also be used that change shape or dimension when a signal (such as voltage or current) is applied.

In the embodiment illustrated in FIGS. 4 and 5, as the actuators 206a, 206b contract they may each exert a force F away from and parallel to the center axis of the platform 112. In operation, the actuators 206a, 206b may both be activated at substantially the same time, and thus both exert an activating force on the platform 112, but in opposite directions. Therefore, because each actuator 206a, 206b may exert a substantially similar force at approximately the same time, the platform 112 may rotate in a direction R. This is because the platform 112 experiences both forces F in opposite directions, but the average force may be a component of each opposite force. For example, the platform 112 is secured at its center axis or center point, and therefore, as the platform 112 experiences each force in an opposite direction, the component of both forces may be angled as compared to both forces. This component force rotates the platform 112 along its axis. It should be noted that the rotation distance of the platform 112 may be minimal and still provide haptic feedback to a user. In one example, the rotation distance may be approximately 100 to 200 μm.

It should be noted that in other embodiments, the actuators 206a, 206b may be configured so that they may exert a force in substantially the same direction, so as to cause the platform 112 to rotate. Additionally, the actuators 206a, 206b may provide altering forces from one another. For example, when actuated, actuator 206a may "pull" the platform 112 while actuator 206b may "push" the platform 112. In this embodiment, the actuators 206a, 206b may be actuated at separate times from one another. This may allow one actuator to act as an active restoring force and the other actuator to assist in platform 112 in its rotation. Additionally, if a single actuator 206 is used, only a single force may be applied to cause the platform 112 to rotate.

Applications for the Haptic Device

The haptic device 102 may act as a virtual button as it provides haptic feedback to a user that may feel (to the user) as if a mechanical button is being depressed or moved horizontally or vertically. The haptic device 102 may be virtual because it may feel as it is displacing in a particular direction, without substantially moving in the vertical or horizontals directions. The haptic device 102 may be used a button or switch for substantially any type of electronic device in which tactile or other haptic feedback is desired. For example, the haptic device 102 may be integrated as a key for a keyboard of a computer, a track pad for a laptop computer, other input/output devices, a power button, and so on.

In one example, a keyboard may include keys utilizing the haptic device 102. The platform 112 may include a visual indicator of a symbol, letter, number, or so on. Then, rather than depressing each key the user may simply touch the outer surface of the platform 112, which may rotate to provide a corresponding haptic feedback. This allows the user to feel as though the keys had been depressed, although the key may have remained substantially in the same vertical position.

In another example, the haptic device 102 may be used as an indicator for the electronic device 100, such as a battery or power meter, volume switch, or the like. In these examples, multiple haptic devices 102 may be aligned adjacent to one another and a user may run his or her fingers over the platform 112 in order to determine an indication. For example, as the user touches each haptic device 102, the platform 112 may either rotate or remain stationary to indicate a certain state, e.g., if one haptic device 102 rotates that could indicate that a certain power level is remaining, whereas if two haptic devices 102 rotate that could indicate that another power level is remaining.

CONCLUSION

The foregoing description has broad application. For example, while examples disclosed herein may focus on electronic devices, it should be appreciated that the concepts disclosed herein may equally apply to other types of devices utilizing haptic feedback. Similarly, although the haptic device may be discussed with haptic feedback, the devices and techniques disclosed herein are equally applicable to input and output mechanisms. Accordingly, the discussion of any embodiment is meant only to be exemplary and is not intended to suggest that the scope of the disclosure, including the claims, is limited to these examples.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto may vary.

What is claimed is:

1. A haptic feedback device for an electronic device, comprising:
   a platform operably connected to the electronic device and secured at a center axis;
   an activating member operably associated with the platform and configured to selectively cause the platform to rotate in a first direction;
   a restoring member comprising a resilient material that supports the platform, moveably couples the platform to rotate about the center axis, and is configured to return the platform to a first position.

2. The haptic feedback device of claim 1, wherein the activating member comprises:
   a first magnetic member configured to be selectively magnetized; and
   a second magnetic member operably connected to the platform and in communication with the first magnetic member.

3. The haptic feedback device of claim 2, wherein the first magnetic member is an electromagnet.

4. The haptic feedback device of claim 1, wherein the resilient material is a spring operably connected to the platform and the electronic device.

5. The haptic feedback device of claim 1, wherein the resilient material is a gel substantially surrounding a portion of an perimeter of the platform.

6. The haptic feedback device of claim 1, wherein the activating member comprises an electoractivated polymer material operably connected to the platform and the electronic device.

7. The haptic feedback device of claim 1, wherein the platform is configured to rotate in a first direction in response to a user touching the platform.

8. The haptic feedback device of claim 1, further comprising a sensor operably connected to the platform and configured to determine when a user selects a button.

9. An electronic device comprising:
   an enclosure;
   a processor operably connected to the enclosure; and
   a haptic device operably connected to the enclosure so that at least a portion of the haptic device is accessible through the enclosure, wherein the haptic device comprises:
      a platform operably connected to the enclosure;
      an activating member in communication with the processor and operably associated with the platform, wherein the activating member is configured to rotate the platform along a center axis; and
      a restoring member comprising a resilient material that supports the platform from the enclosure, moveably couples the platform to rotate about the center axis, and is configured to return the platform to a first position.

10. The electronic device of claim 9, further comprising a sensor in communication with the processor and configured to determine when a user selects the platform.

11. The electronic device of claim 10, wherein the sensor is operably connected to a top surface of the platform.

12. The electronic device of claim 9, wherein the activating member comprises:
    an electromagnet operably connected to the enclosure and in communication with the processor; and
    a magnetic member operably connected to the platform and in communication with the electromagnet, wherein when the electromagnet is in a first state the platform rotates in a first direction and when the electromagnet is in a second state the platform rotates in a second direction.

13. The electronic device of claim 9, wherein the activating member comprises a first electroactive polymer operably connected to the platform and to the enclosure and in communication with the processor and when the first electroactive polymer is activated the platform rotates in a first direction.

14. The electronic device of claim 13, further comprises a second electroactive polymer operably connected to the platform and to the enclosure and when the second electroactive polymer is activated the platform rotates in the first direction.

15. The electronic device of claim 9, wherein the resilient material is a spring operably connected to the platform and the enclosure.

16. The electronic device of claim 9, wherein the resilient material is a gel operably connected to the enclosure and operably associated with a portion of the platform.

17. A method for providing tactile feedback in an electronic device, comprising:
    detecting, using a processing unit, an input received by the electronic device;
    causing a device to rotate about a center axis by activating an electroactive polymer in response to the input; and
    causing a resilient member to restore the device to an original position after one of:
        a select time; and
        a select rotation distance; wherein
    the resilient member supports the device, moveably couples the device to rotate about the center axis, and is configured to restore the device to the original position.

18. The method of claim 17, wherein the device is a platform.

19. The method of claim 17, wherein the resilient member is a spring.

20. The method of claim 17, wherein the resilient member is a gel.

* * * * *